United States Patent
Doganis et al.

(10) Patent No.: US 11,893,314 B2
(45) Date of Patent: Feb. 6, 2024

(54) METHOD FOR DESIGNING A 3D OBJECT BY USING A VIRTUAL 3D GRID AND HAND DRAWN SKETCHES

(71) Applicant: Dassault Systemes, Vélizy-Villacoublay (FR)

(72) Inventors: Fivos Doganis, Vélizy-Villacoublay (FR); Selin Alp, Toulouse (FR)

(73) Assignee: Dassault Systemes, Vélizy-Villacoublay (FR)

( * ) Notice: Subject to any disclaimer, the term of this patent is extended or adjusted under 35 U.S.C. 154(b) by 0 days.

(21) Appl. No.: 17/643,959

(22) Filed: Dec. 13, 2021

(65) Prior Publication Data

US 2022/0198078 A1 Jun. 23, 2022

(30) Foreign Application Priority Data

Dec. 17, 2020 (EP) .................................... 20306591

(51) Int. Cl.
*G06F 30/10* (2020.01)

(52) U.S. Cl.
CPC .................................... *G06F 30/10* (2020.01)

(58) Field of Classification Search
CPC .......... G06F 30/10; G06F 30/20; G06F 30/00; G06F 30/25; G06F 30/27; G06F 30/28; G06F 2111/00–2119/22; G06T 17/20; G06T 19/20; G06T 17/30; G06T 2200/24; G06T 2219/2021; G06T 17/205; G06T 17/00; G06T 19/006
See application file for complete search history.

(56) References Cited

U.S. PATENT DOCUMENTS

| 2021/0049826 A1* | 2/2021 | Takahashi ............... G06T 17/20 |
| 2021/0279957 A1* | 9/2021 | Eder ....................... G06V 20/64 |

FOREIGN PATENT DOCUMENTS

| EP | 2 600 315 A1 | 6/2013 |
| WO | 2013/109245 A1 | 7/2013 |

OTHER PUBLICATIONS

Gain, James (2000). Enhancing Spatial Deformation for Virtual Sculpting. (Year: 2000).*

(Continued)

*Primary Examiner* — Rehana Perveen
*Assistant Examiner* — Troy A Maust
(74) *Attorney, Agent, or Firm* — Oblon, McClelland, Maier & Neustadt, L.L.P.

(57) ABSTRACT

A computer implemented method for designing a 3D object in a scene including obtaining a 3D grid of cubes in the scene, said 3D grid of cubes controlling a subdivision surface, said subdivision surface modeling the 3D object, receiving a user stroke of a curve on at least one external face of at least a cube of the grid of cubes, determining a first set of cubes which intersect with the curve on the external face, a second set of cubes which is adjacent to the first set of cubes, perpendicularly to the external face, and a third set of cubes, called intersected cubes, comprising the first set of cubes and the second set of cubes, and for each intersected cube, deforming the intersected cube by moving at least one vertex of said intersected cube so as to fit the curve thereby deforming the subdivision surface.

20 Claims, 19 Drawing Sheets

(56) References Cited

OTHER PUBLICATIONS

James Gain, and Patrick Marais, "Warp Sculpting" IEEE Transactions on Visualization and Computer Graphics, vol. 11, No. 2, Mar./Apr. 2005 (Year: 2005).*

The extended Euopean search report dated May 28, 2021 in corresponding European Patent Application No. 20306591.7 (8 pages).

* cited by examiner

METHOD FOR DESIGNING A 3D OBJECT BY USING A VIRTUAL 3D GRID AND HAND DRAWN SKETCHES

CROSS-REFERENCE TO RELATED APPLICATIONS

This application claims priority under 35 U.S.C. § 119 or 365 to European Application No. 20306591.7, filed Dec. 17, 2020. The entire contents of the above application(s) are incorporated herein by reference.

FIELD

The disclosure pertains to the field of 3D content creation. In addition, the disclosure relates to a method for designing a 3D object by using a virtual 3D grid and hand drawn sketches. The embodiments are particularly well suited for the creation of a 3D object in an immersive environment (augmented or virtual reality) and especially for augmented reality, but it could also apply to the creation of a 3D object using a standard device such as a desktop, a laptop or a mobile device.

BACKGROUND

In the field of 3D content creation, the advent of the video game "Minecraft"® has made it possible to intuitively create 3D objects without any prior knowledge of Computer Aided Design. In this game, 3D objects are made of an assembly of cubes, which are based on volume elements (voxels). The user is put in a virtual world, and he can create his own structures by adding cubes and adding a texture to the cubes.

In a variant called "Minecraft Earth"®, which is suitable for mobile devices having a camera (mobile phone, tablet), the user can create 3D objects in augmented reality, i.e., using reality as a context. The user turns around the object, which eases the process of creation.

However, the rendering of those objects is very cubic, even when using very small cubes. Thus, it may not be suitable for creating objects having curved shapes. In fact, most of the objects of the everyday life do not have sharp edges, but rather curved ones.

The application "xShape", which runs in the "3DEXPERIENCE" platform of Dassault Systèmes, is intended to more advanced users. Starting from a quite simple shape, for example a cube, the user controls the shape using intuitive tools like dragging with respect to control points which are located on edges, faces, or vertices.

In order to avoid manipulating the edges, faces, or vertices one by one, the application offers an interesting functionality called "Align Cage Points", which uses a curve to modify an existing volume. The user sketches a curve around the 3D object, and the shape of the 3D objects is modified according to the curve.

The resulting shape is smooth and editable. However, only trained designers can use such complex applications. In addition, according to the user experience, several steps have to be implemented, and the chain of steps has several interruptions, even for the experienced user.

Indeed, modifying volumes with curves using this paradigm involves:
creating a volume
creating a curve by
selecting a plane,
creating points on the plane,
editing the points on the plane to create a curve close to the user's intent
selecting the parts of the volume which will be influenced by the curve.

Eventually, the volume is deformed along the curve, but the result might not be as close to the user's original intent, and often requires further tweaking.

SUMMARY

Therefore, there is a need for obtaining a computer implemented method for designing a 3D object having curved edges, which is intuitive to most users, and which enables the creation of new shapes as fast as possible.

An object of the present disclosure is a computer implemented method for designing a 3D object in a scene, comprising the steps of:
a) providing a 3D grid of cubes in the scene, said 3D grid of cubes controlling a subdivision surface, said subdivision surface modeling the 3D object;
b) receiving a user stroke of a curve on at least one external face of at least a cube of the grid of cubes;
c) determining a first set of cubes which intersect with the curve on the external face, a second set of cubes which is adjacent to the first set of cubes, perpendicularly to the external face, and a third set of cubes, called intersected cubes, comprising the first set of cubes and the second set of cubes;
d) for each intersected cube, deforming the intersected cube by moving at least one vertex of said intersected cube so as to fit the curve, thereby deforming the subdivision surface.

Advantageously, the method comprises a step c') which is executed after step c), said step c') comprising the sub-steps of:
computing the number of cubes of the 3D grid on both sides of the intersected cube in the plane of the external face,
removing, from the scene, the set of cubes having the lowest number of cubes.

Advantageously, step d) comprises filtering vertices of the intersected cubes so as to move only the vertices which are not shared with vertices of non-intersected cubes.

Advantageously, step d) comprises propagating the curve on the second set of cubes, and moving vertices of the second set of cubes so as to fit the propagated curve.

Advantageously, the vertex is moved by applying an orthogonal projection of the vertex on the curve.

Advantageously, the method comprises:
computing the shortest distance between each vertex and the curve;
correcting the position of one of said vertices so as to have a continuity of the subdivision surface, if the shortest distance to the curve is equal for at least two vertices.

Advantageously, step a) comprises detecting a user interaction comprising contiguously adding or removing cubes of the first and/or second set of cubes by hovering over the 3D object while holding a pointing element.

Advantageously, the scene is located in an immersive environment.

Advantageously, the subdivision surface is computed by using the Catmull-Clark scheme.

Advantageously the 3D grid of cubes and the subdivision surface are superimposed, the 3D grid being displayed in partial transparency.

Advantageously, the method comprises receiving a user input comprising drawing a line in the scene, the design of the 3D object being completed by computing the symmetric of the subdivision surface with regards to the line.

The disclosure also relates to a computer program product comprising computer-executable instructions to cause a computer system to carry out the aforementioned method.

The disclosure also relates to a non-transitory computer-readable data-storage medium containing computer-executable instructions to cause a computer system to carry out the aforementioned method.

The disclosure also relates to a computer system comprising a processor coupled to a memory, the memory storing computer-executable instructions to cause the computer system to carry out the aforementioned method.

BRIEF DESCRIPTION OF THE DRAWINGS

Additional features and advantages of the present embodiments will become apparent from the subsequent description, taken in conjunction with the accompanying drawings.

DETAILED DESCRIPTION

The invented method is disclosed in relation with FIGS. 1 to 17.

Figure 1:
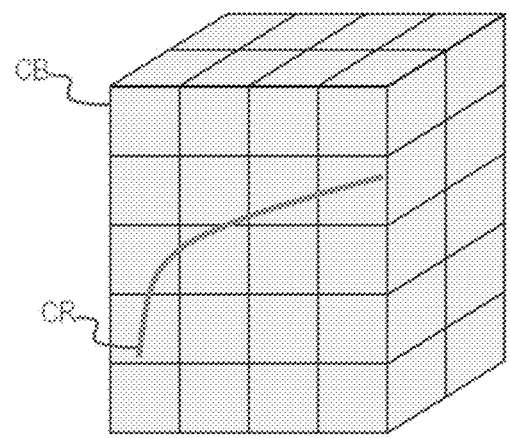
FIGS. 1, 2, 3, 4, 5, 6, 7, 8, 9, 10, 11, 12, 13, 14, 15, 16 and 17 illustrate the different steps of the method according to the embodiments.

In a first step a) of the invented method a 3D grid of cubes CB is provided in the scene, as represented in FIG. 1. Each cube corresponds to a voxel. The user may lay a full 3D grid of cubes CB in the scene and anchor it in the scene. The dimensions of the 3D grid of cubes CB may be initially set by the user, as well as the size of each cube. Default dimensions of the grid and default dimensions of each cube may also be used.

The 3D grid of cubes CB controls a subdivision surface, which models the 3D object. The 3D grid of cubes CB is the control cage of the subdivision surface.

The user may add or delete a single cube, or a set of cubes, starting from the 3D grid of cubes CB. For that, the user hovers over the 3D grid of cubes CB while holding a pointing element contiguously adding or removing cubes.

The user may remove only the cubes which are intersected by the cursor when the pointing element is held (in one layer in depth). He may also remove cubes by "column": a column is a series of cubes, which are aligned perpendicularly to the external face of the cube on which the cursor is directed (in several layers in depth).

Deleting the cubes in one layer or in several layers may be defined by the user in a contextual menu of the application.

Alternatively, the user may start from an "empty grid", i.e., a 2D array corresponding to the footprint of the 3D grid in the scene, instead of starting from a full grid. The dimensions of the 2D array may be initially set by the user, as well as the size of each square. Default dimensions may also be used. Then, the user adds cubes, by contiguously hovering over the grid of cubes while holding a pointing element.

In another alternative, the 3D grid may be only partially full, containing a coarse approximation of a 3D object (obtained in a previous step such as a 3D voxel object import, 3D scene reconstruction, by using a vision algorithm or by using machine learning).

Therefore, creating an assembly of cubes is straightforward, be it starting from a full grid or from an empty grid. The cubes are created contiguously like in most popular programs, thus it is very user-friendly. The cubes are aligned inside a grid and can only be added as neighbors of an existing cube, or directly on the grid displayed on the ground. This helps creating a cubic hull around the desired shape.

In an embodiment, the 3D grid of cubes CB and the subdivision surface which is controlled by the 3D grid of cubes CB are superimposed. The 3D grid of cubes CB is displayed in partial transparency, so that the user may easily control the 3D grid of cubes CB and the subdivision surface.

After that step, the subdivision surface modeling the 3D object is a coarse volume, rather cubical, with sharp edges.

FIG. 1 illustrates the 3D grid of cubes CB, or a sub-element of it.

In a second step b) of the method, the user sketches a curve CR on at least one external face of at least a cube of the grid of cubes CB. The main idea of the method is to sculpt deformable cubes (voxels), which would be used as a control cage for the subdivision surface.

The 3D grid of cubes is more than a bounding volume. It also serves as a scaffold, a drawing support where the user can directly draw, allowing fast and accurate 3D stroke placement.

The user stroke may be beautified and smoothened, so as to produce a clean 3D curve CR. Beautification may be done by interpolating the curve, according to the techniques which are known by the skilled person.

The subdivision surface is computed each time a curve CR has been drawn. In step c) of the method, a first set of cubes which intersect with the curve CR on the external face is determined. In order to determine the external face, it may be determined among the different faces of the grid, which one is closest to the screen plane, e.g., by computing the dot product of the normal of the planes.

A second set of cubes, which is adjacent to the first set of cubes perpendicularly to the external face, i.e., contiguously connected to the first set of cubes perpendicularly to the external face, is also determined. It can be considered that the first set of cubes is defined by the curve according to a first layer, and the second set of cubes is defined by the curve according to deeper layers, with regards to the plane of the external face. The second set of cubes may comprise one or several layers in the depth direction.

Figure 2:
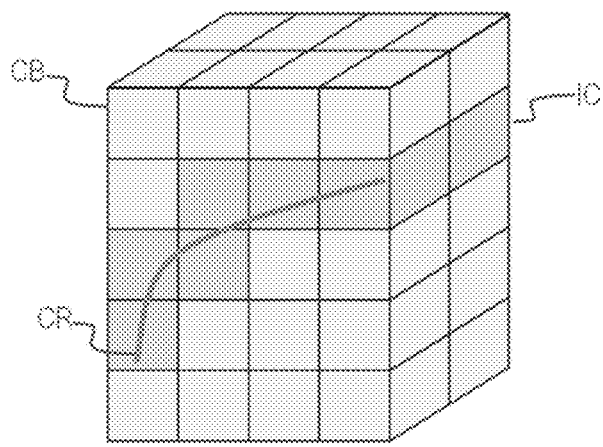

A third set of cubes, called intersected cubes IC, comprises the first set of cubes and the second set of cubes, as illustrated by FIG. 2.

Each cube of the intersected cubes IC has its coordinates in the scene, thus the position of the vertices is easily determined. The position of the vertices is changed so as to match the curve CR, which deforms the subdivision surface (step d)).

Thus, the subdivision surface matches the last created curve as soon as it has been drawn once the stylus or finger has been lifted. This way of designing a 3D object is close to the clay modeling situation. An ideal approach is indeed to virtually sculpt a 3D object taking inspiration from clay modeling (widely used in automobile industry) or woodworking techniques. Those techniques are widely used in automobile industry, in order to sculpt a 3D model.

The determination of the vertices VT which are to be moved depends on the position of the intersected cubes IC with regards to the 3D grid of cubes CB.

Figure 3:
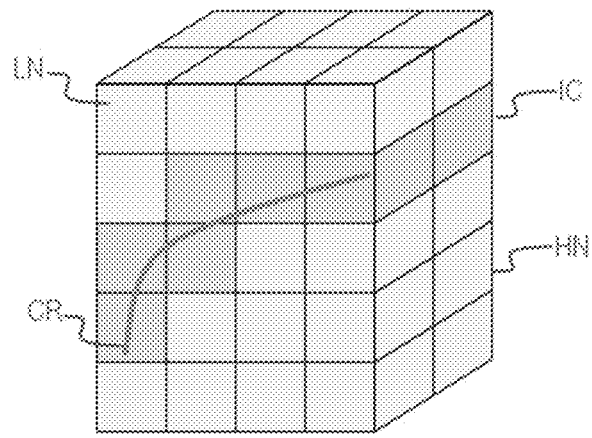

The curve CR may be drawn on the cubes which are located at the periphery of the 3D grid of cubes CB. In case the intersected cubes IC are not at the periphery of the 3D grid of cubes CB, as illustrated by FIG. 3, the set of cubes having the lowest number of cubes LN, regarding the number of cubes, are removed from the 3D scene, and the set of cubes having the highest number of cubes HN is kept for the design of the object. The separation may be implemented by using a neighbor search calculation.

Figure 4:
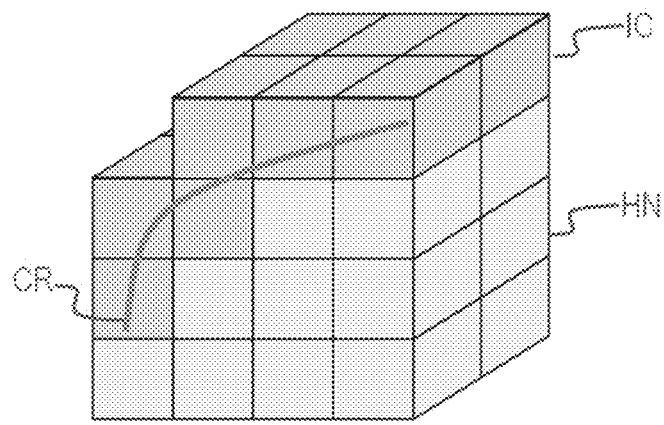

Removing the set of cubes having the lowest number of cubes LN from the scene also gives the impression of sculpting. FIG. 4 illustrates the 3D grid of cubes CB without the smallest part. Note that this automatic way of "chipping" away at the volume is meant to make the sculpting process faster, without any interruption, encouraging the user to refine the model progressively. Alternatively, it is possible to let the user choose which part to keep after the curve CR has been drawn (using a menu, a gesture, or a partial "Undo" command for example).

Figure 5:
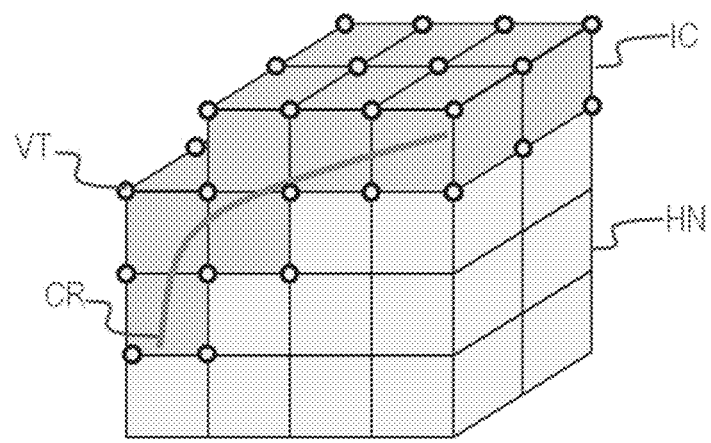
Figure 6:
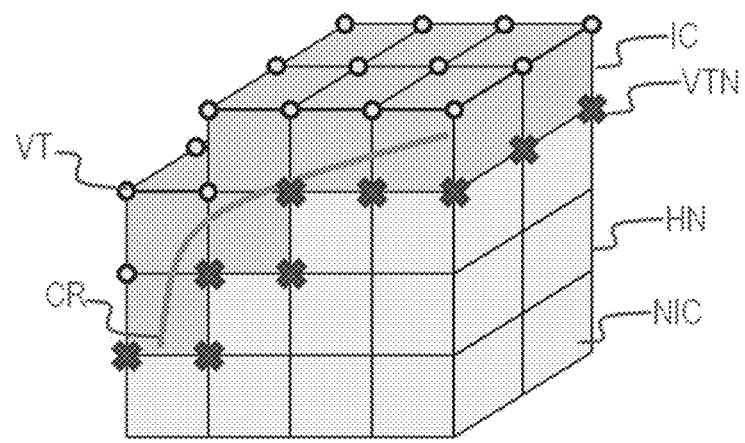
Figure 7:
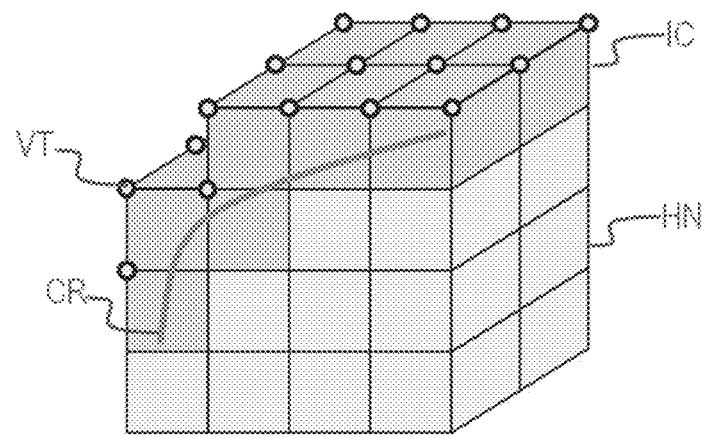

Once the smallest part has been removed, the intersected cubes IC can be deformed, so as to fit to the curve CR. FIG. 5 illustrates all the vertices VT of the intersected cubes IC. Not all of them shall be moved. Therefore, step d) comprises filtering vertices VT of the intersected cubes IC so as to move only the vertices VT which are not shared with vertices of non-intersected cubes NIC. The vertices VTN of the intersected cubes IC which are shared with non-intersected cubes NIC must be present in the grid and shall be removed from the list of vertices to move, as illustrated by FIGS. 6 and 7. Only the vertices which are represented by a circle should move; the ones which are represented by a cross should keep still.

Figure 8:
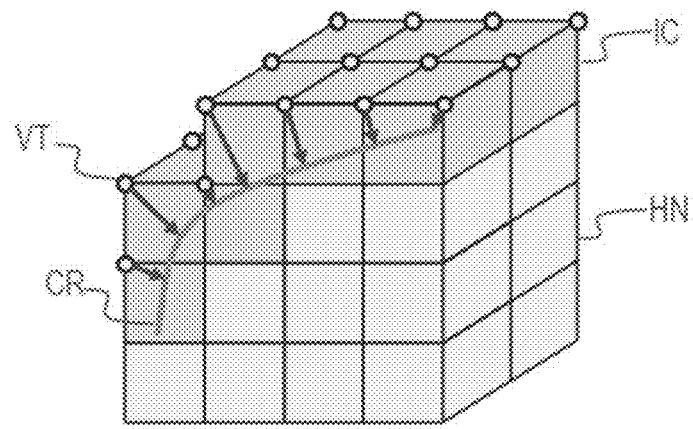
Figure 9:
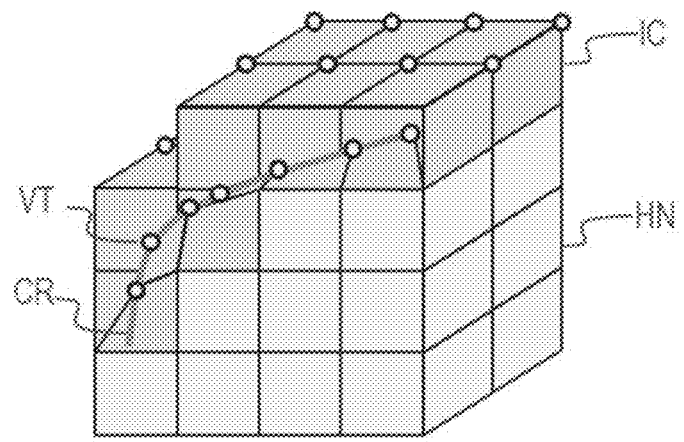

The deformation of each intersected cube IC is made by computing, for each vertex belonging to the external face, the closest corresponding point of the sketched curve. The vertex VT is moved by applying an orthogonal projection of the vertex VT on the curve CR, as illustrated by FIGS. 8 and 9. A vertex may be moved to one of the extremities of the curve CR, in particular when the closest corresponding point of the sketched curve is one of the extremities of the curve CR.

Figure 10:
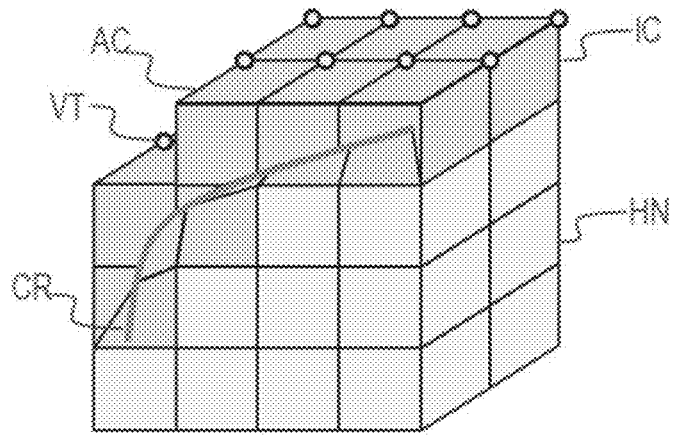

The resulting moved vertices VT of the external face are illustrated in FIGS. 9 and 10.

Figure 11:
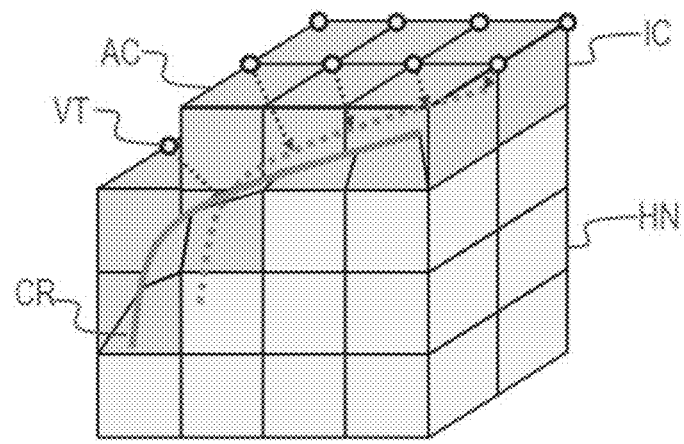
Figure 12:
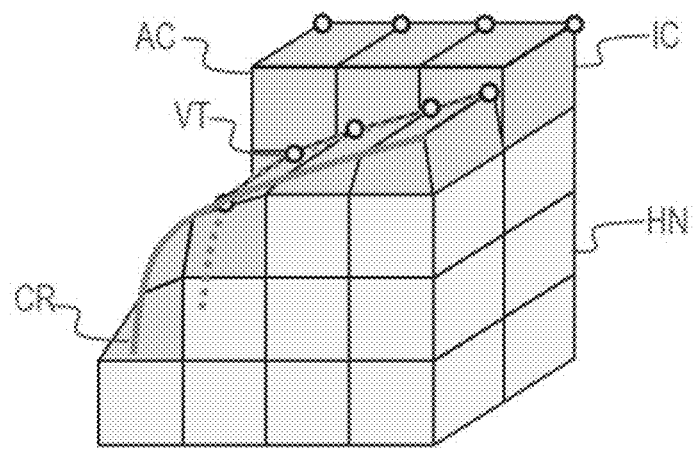
Figure 13:
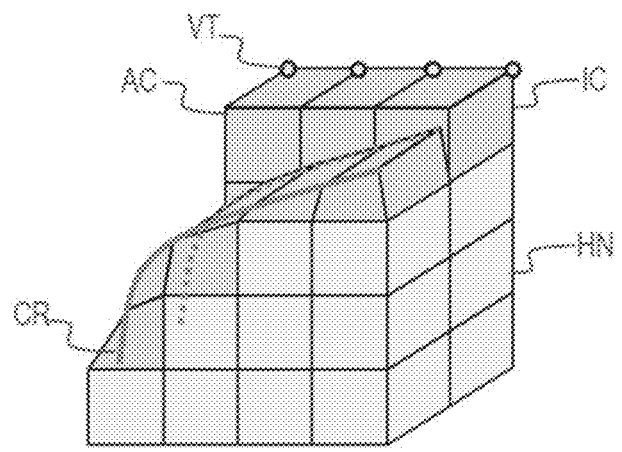
Figure 14:
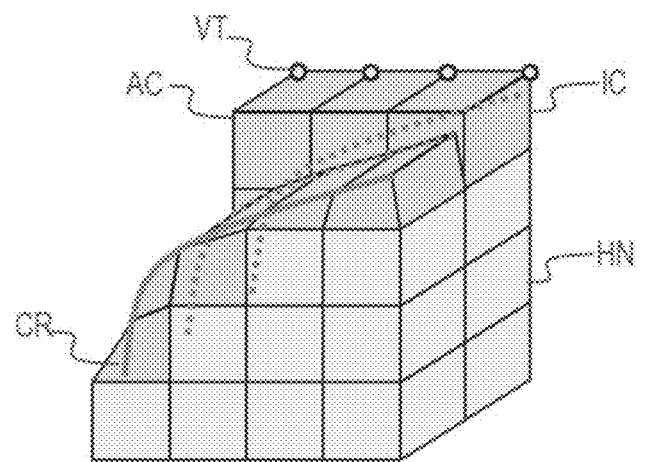
Figure 15:
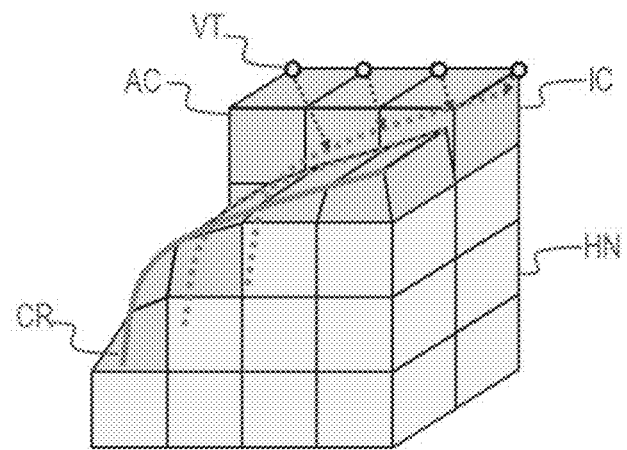
Figure 16:
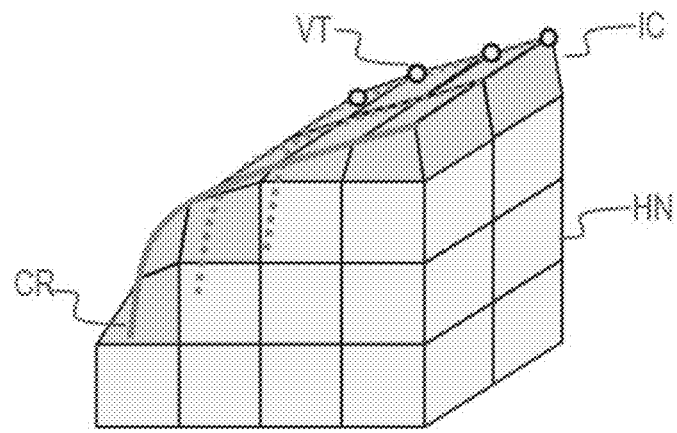
Figure 17:
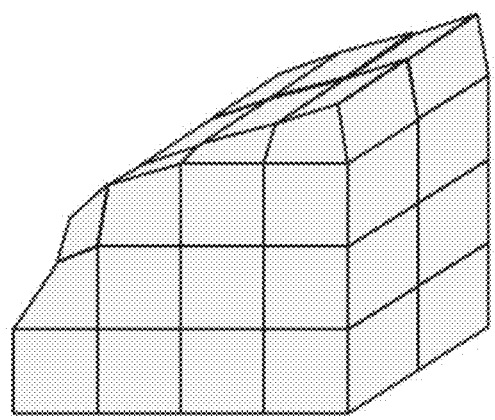

Then the curve is propagated on the second set of cubes AC, as illustrated by FIG. 11. The propagation comprises the duplication of the curve CR on the adjacent face which is directly adjacent to the cube which has just been moved. The vertices of the second set of cubes AC are also moved, so as to fit the propagated curve. The displacement is made the same way as for the vertices of the external face.

The vertices are moved, and the curve is propagated, until all the cubes of a column have been deformed, as illustrated by FIGS. 12 to 16. The term "column" refers to a set of individual cubes which are aligned perpendicularly to the external face of a cube of the first set of cubes.

Since the subdivision surface is controlled by the 3D grid of cubes, the shape of the subdivision surface is modified by deforming the cubes.

In an embodiment, the subdivision surface modeling the 3D object is computed by using the Catmull-Clark scheme. The Catmull-Clark scheme is applied on the control mesh which results from the deformation of the 3D grid of cubes. All edges are initialized as sharp edges but the edges to which the moved vertices belong are redefined as smooth edges. Other approximating schemes may be used, such as the Doo-Sabin scheme.

The subdivision surface is a continuous, editable, with a clean resulting topology, and no polygons. Therefore, the subdivision surfaces, can be used as-is, or exported to other CAD tools, for further edition.

Cubes and deformed cubes have a very structured geometry by nature, with their parallel faces and corners, thus the resulting subsurface is easily machinable, i.e., it can be produced by either additive or subtractive manufacturing.

The modeled 3D object is also versatile, to the extent that its sharp and smooth edges are mixed, which allows the creation of organic shapes but also of surfaces like the ones created by industrial designers.

Figure 18:
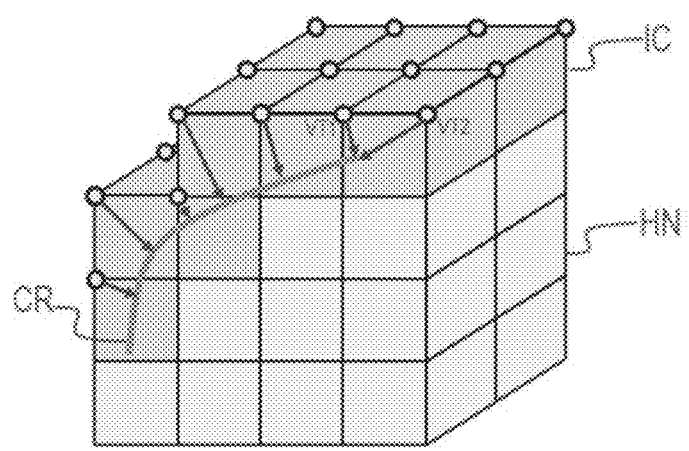
FIGS. 18, 19, 20 and 21 illustrate the steps of dealing with coincident vertices.

FIGS. 18 to 21 illustrate the steps of dealing with coincident vertices. Indeed, some vertices (VT1, VT2) may be projected on the same point of the curve. This situation may arise, for example, at the extremity of the curve CR, as illustrated by FIG. 18.

Figure 19:
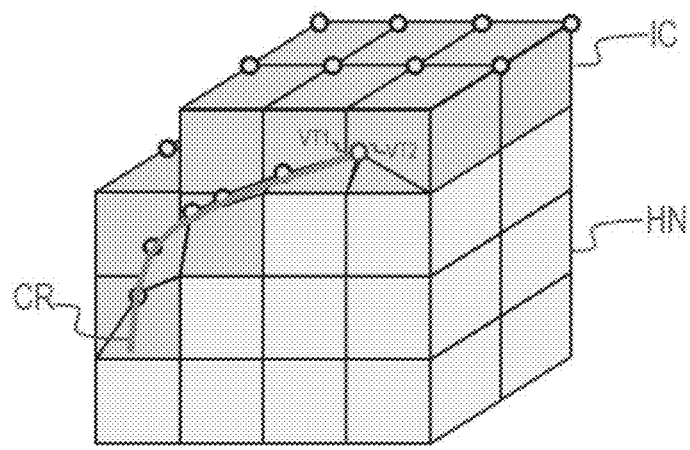
Figure 20:
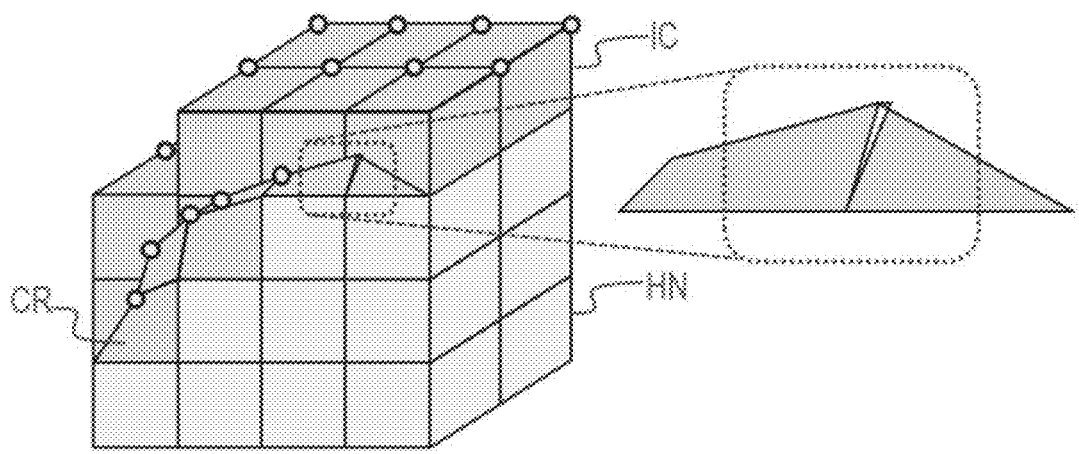

We can see, in FIG. 19 and in the enlargement window in FIG. 20, that moving two vertices of a cube to the same point opens the subdivision surface.

Therefore, if the shortest distance to the curve CR is equal for at least two vertices (VT1, VT2), the following sub-steps are implemented:
  computing the shortest distance between each vertex (VT1, VT2) and the curve CR;
  correcting the position of one of said vertices (VT1, VT2) so as to have a continuity of the subdivision surface.

Figure 21:
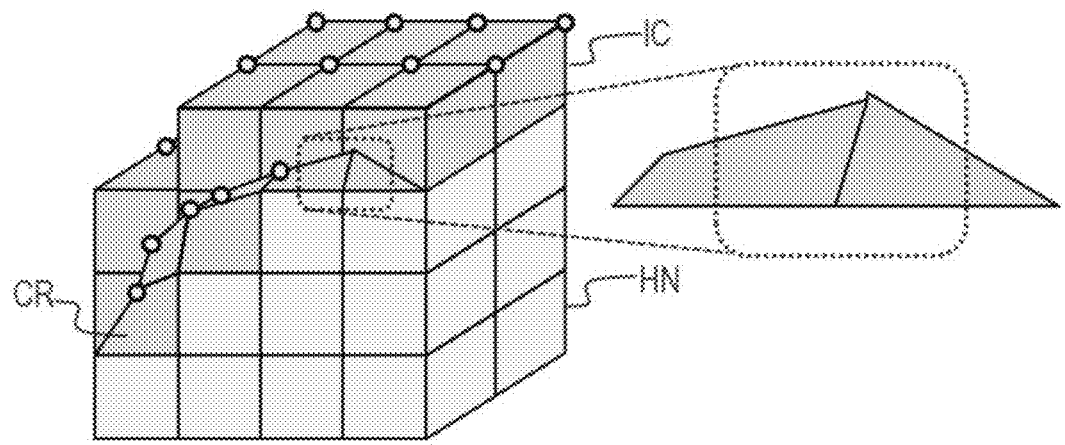

The continuity of the subdivision surface may be obtained for by correcting the position of one of the coincident vertices (VT1, VT2) i.e., in the plane of the vertices, for example along the vertical direction, as illustrated by FIG. 21. It could also be ensured that two vertices are at a minimum distance from each other.

Alternatively, in order to avoid coincident vertices, it could be ensured that the vertices do not move more than a certain value, e.g., half of the edge of the cube. This solution is more stable because it avoids large displacements of vertices, but it does not necessarily preserve a shape that fits to the curve.

In another embodiment, the user may contiguously add new cubes, which deforms the subdivision surface. The user hovers over the 3D object while holding a pointing element. When a cube is added to a deformed cube, the new cube is added with sharp edges while adapting to the deformation next to it. This allows adding material as a sculptor would do, in order to then rework it and get closer to the desired 3D shape. The same can be done for removing cubes.

The invented method may be implemented either in a virtual reality environment (virtual reality VR), or in augmented reality (augmented reality AR). In an embodiment, a tablet-based AR solution may be used, instead of a VR, for the following reasons:
  the non-isolating nature of AR:
    the user is still in contact with the environment while designing the object and may use the environment for context and inspiration;
    other users can even see the designer as well as the 3D objects being designed, by looking at the designer's screen or even at their own screen (if the application has been created with multi-user AR experiences in mind, all participants have their own augmented view of the scene);

headaches are reduced compared to virtual reality;

AR applications are now widespread;

the latest generation of frameworks such as Apple's "ARKit" or Google's "ARCore" make it easy to have AR experiences on hand-held phones or tablets, at pocket's reach, instead of having to use cumbersome VR hardware;

using a pen and tablet feels natural and provides accuracy through haptic feedback by constraining the movement of the pen to the plane of the tablet.

Note that both AR and VR let the user walk around the model to sculpt, thus decoupling 3D modeling from 3D scene navigation interactions. The user can focus on creating a 3D model instead of also having to deal with how to modify the point of view of the virtual camera to find the best angle. Most often, displaying the model at its real scale also makes the modeling process faster and easier.

FIGS. 22 to 40 illustrate the design of an object (an armchair) with the method according to the embodiments, in AR.

Figure 22:
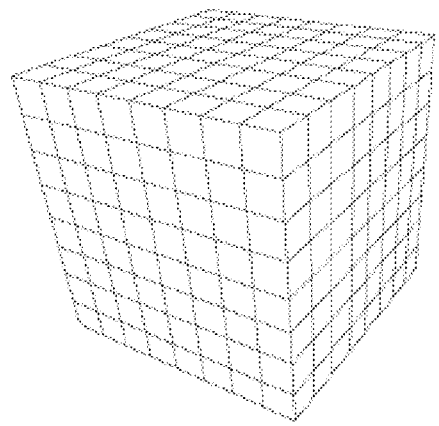
FIGS. 22, 23, 24, 25, 26, 27, 28, 29, 30, 31, 32, 33, 34, 35, 36, 37, 38, 39 and 40 illustrate the design of an object with the method according to the embodiments.

FIG. 22: a 3D grid of cubes is provided in the scene. The 3D grid of cubes and the subdivision surface which is controlled by the 3D grid of cubes are superimposed.

Figure 23:
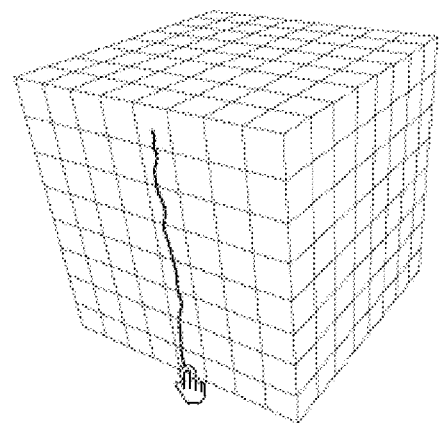
Figure 24:
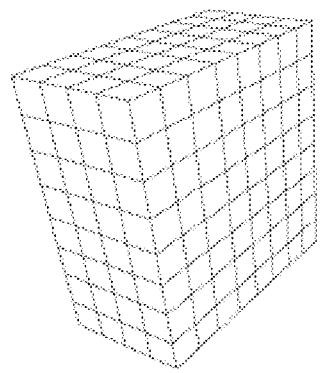

FIGS. 23 and 24: the user selects the "cut" command and sketches a stroke on all the adjacent cubes according to the vertical direction, which removes from the scene the part with the lowest number of cubes (removal of columns of cubes).

Figure 25:
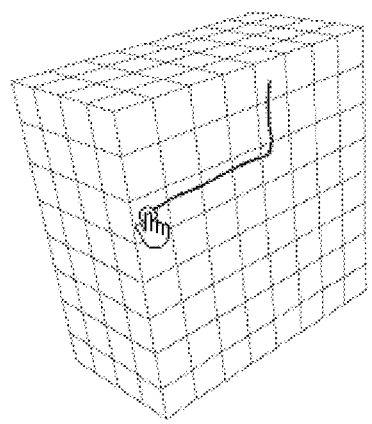
Figure 26:
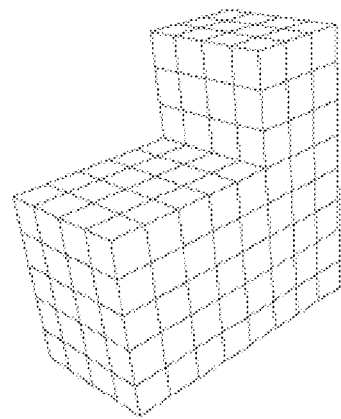
Figure 27:
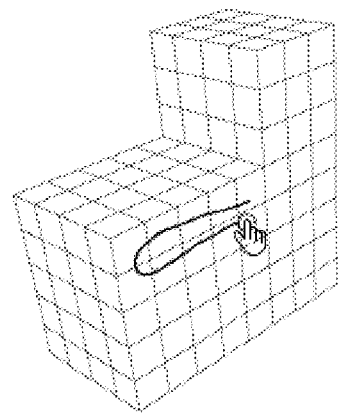
Figure 28:
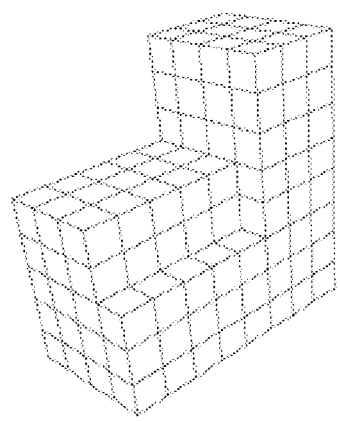
Figure 29:
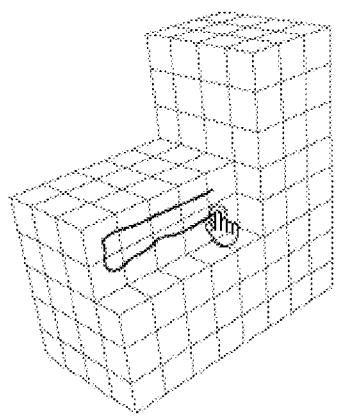
Figure 30:
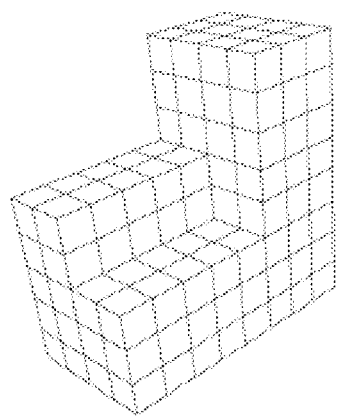
Figure 31:
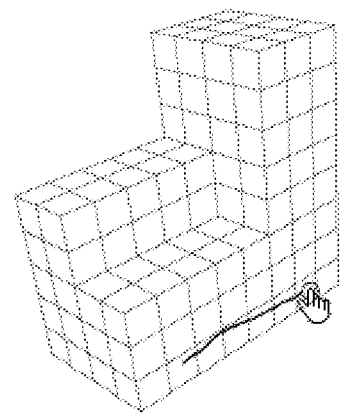
Figure 32:
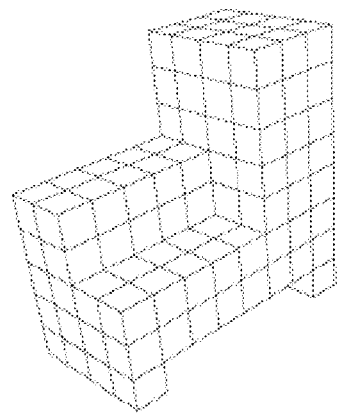
Figure 33:
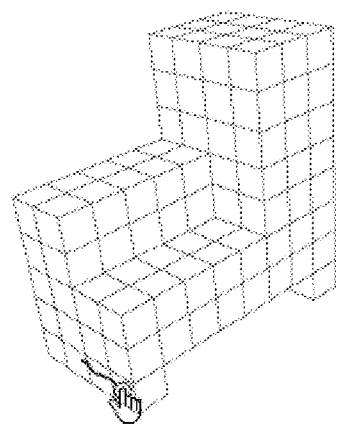
Figure 34:
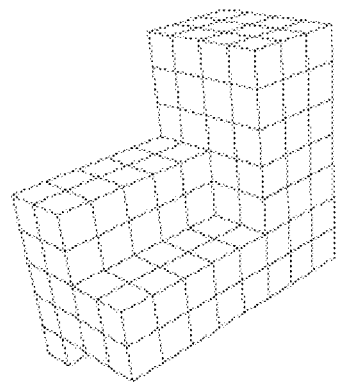

FIGS. 25 and 26: the user reiterates the "cut" command on another set of cubes.

FIGS. 27 to 30: the user selects a command "remove cubes", and sketches a curve on cubes, which removes only the cubes which are intersected by the curve.

FIGS. 31 to 34: the user selects the "cut" command on other set of cubes, so as to design the feet of the armchair (sharp edges).

Figure 35:
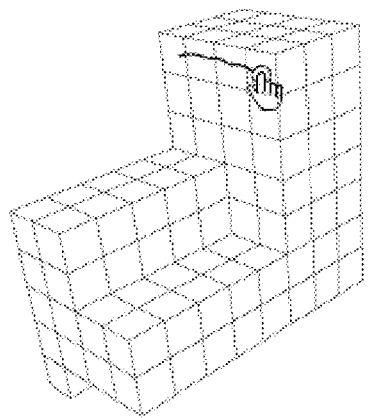

FIG. 35: the user selects the "deform" command, so as to design the backrest of the armchair (smooth edges). The user sketches a stroke of a curve on the first set of cubes which intersect with the curve, which serves as a drawing support.

Figure 36:
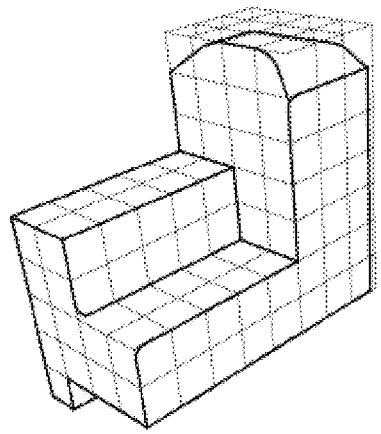

FIG. 36: the first set of cubes, as well as the second set of cubes which is adjacent to the first set of cubes perpendicularly to the external face, are deformed, so as to fit with the curve. The subdivision surface is accordingly deformed.

Figure 37:
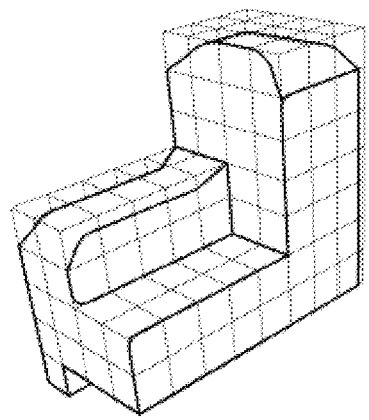

FIG. 37: the deformation is reiterated, so as to design the armrest (smooth edges).

Figure 38:
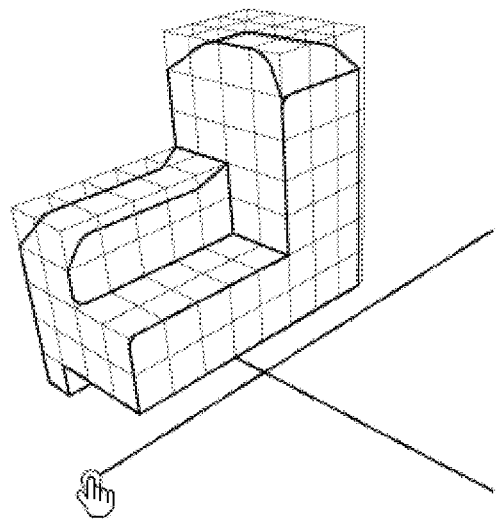
Figure 39:
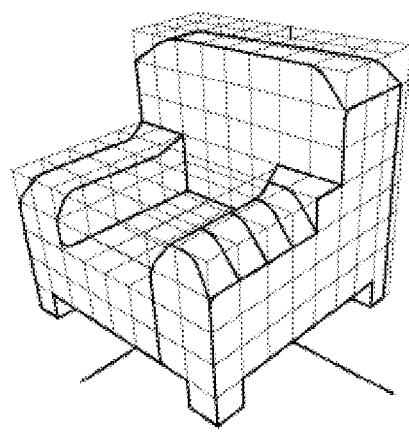

FIGS. 38 and 39: the user selects the "symmetry" command. He draws a line in the scene, then the design of the 3D object is completed by computing the symmetric of the subdivision surface with regards to the line. As the indices defining each cube are known, finding its symmetric cube is simple. Each deformed cube must have its symmetric correctly deformed. To do this, we need to:

modify the positions of the vertices of the symmetrical cube;

modify the list of vertices involved in a smooth edge;

compute the number of existing pieces in the scene. Thus, if the calculation of the symmetry of a subdivision surface adds a second piece to the scene, an error message is sent.

Figure 40:
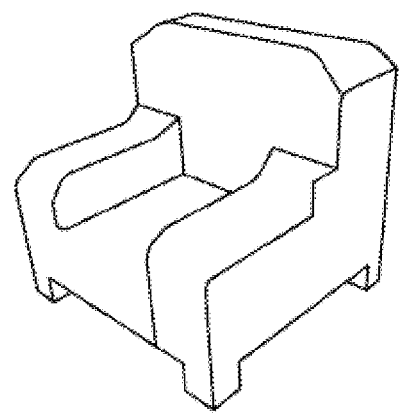

FIG. 40: the design of the 3D object is complete.

The afore-described example confirms that the user experience is fluid, without any interruption. It also avoids clicking too many times. New shapes may be quickly created.

The inventive method can be performed by a suitably-programmed general-purpose computer, possibly including a computer network, storing a suitable program in non-volatile form on a computer-readable medium such as a hard disk, a solid state disk or a CD-ROM and executing said program using its microprocessor(s) and memory.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

A computer suitable for carrying out a method according to an exemplary embodiment is described with reference to FIG. 41. In FIG. 24, the computer includes a Central Processing Unit (CPU) P which performs the method step described above while running an executable program, i.e., a set of computer-readable instructions, stored in a memory device such as RAM MEM1 or ROM MEM2 or hard disk drive (HDD) MEM3, DVD/CD drive MEM4, or stored remotely. Moreover, one or more computer files defining the concrete-reinforcing bars may also be stored on one or more of memory devices MEM1 to MEM4, or remotely.

The claimed invention is not limited by the form of the computer-readable media on which the computer-readable instructions of the inventive process are stored. For example, the instructions and files can be stored on CDs, DVDs, in FLASH memory, RAM, ROM, PROM, EPROM, EEPROM, hard disk or any other information processing device with which the computer communicates, such as a server or computer. The program can be stored on a same memory device or on different memory devices.

Further, a computer program suitable for carrying out the inventive method can be provided as a utility application, background daemon, or component of an operating system, or combination thereof, executing in conjunction with CPU CP and an operating system such as Microsoft VISTA, Microsoft Windows 8, UNIX, Solaris, LINUX, Apple MAC-OS and other systems known to those skilled in the art.

CPU P can be a Xenon processor from Intel of America or an Opteron processor from AMD of America, or can be other processor types, such as a Freescale ColdFire, IMX, or ARM processor from Freescale Corporation of America. Alternatively, the CPU can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

Figure 41:
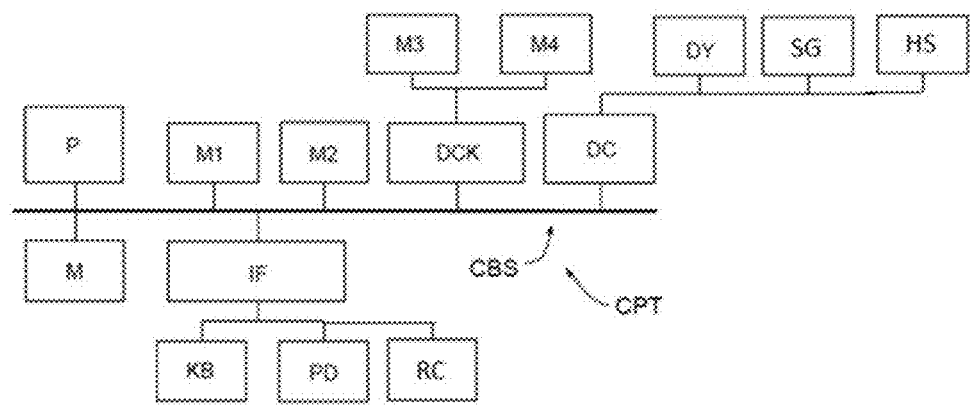
FIGS. 41 and 42 illustrate block diagrams of respective computer systems suitable for carrying out a method according to different embodiments.

The computer CPT in FIG. 41 also includes a network interface NI, such as an Intel Ethernet PRO network interface card from Intel Corporation of America, for interfacing with a network, such as a local area network (LAN), wide area network (WAN), the Internet and the like. The method may be implemented remotely, by means of a web application.

The computer further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard, the sensitive surface for the touch mode and the pointing device, together with the display controller and the I/O interfaces, form a graphical user interface, used by the user to provide input commands—e.g. to move the pointer—and by the computer for displaying the three-dimensional scene and the graphical tool.

In augmented reality, the inventive method can be performed by using a hand-held device as a computer CPT. The hand-held device is equipped with a camera so as to superimpose the designed object in the real scene which is captured by the camera.

Alternatively, in AR, a pair of mixed reality head-mounted smartglasses SG, such as Microsoft Hololens, could be used. The 3D object is displayed, while the commands are provided by hand detection, or by at least one remote control RC.

In VR, a virtual reality headset HS, such as Oculus Quest may be used, so as to display the 3D object and the 3D scene to the user. The 3D object is displayed, while the commands are provided by hand detection, or by at least one remote control RC.

Disk controller DKC connects HDD MEM3 and DVD/CD MEM4 with communication bus CBS, which can be an ISA, EISA, VESA, PCI, or similar, for interconnecting all of the components of the computer.

A description of the general features and functionality of the display, keyboard, pointing device, as well as the display controller, disk controller, network interface and I/O interface is omitted herein for brevity as these features are known.

Figure 42:
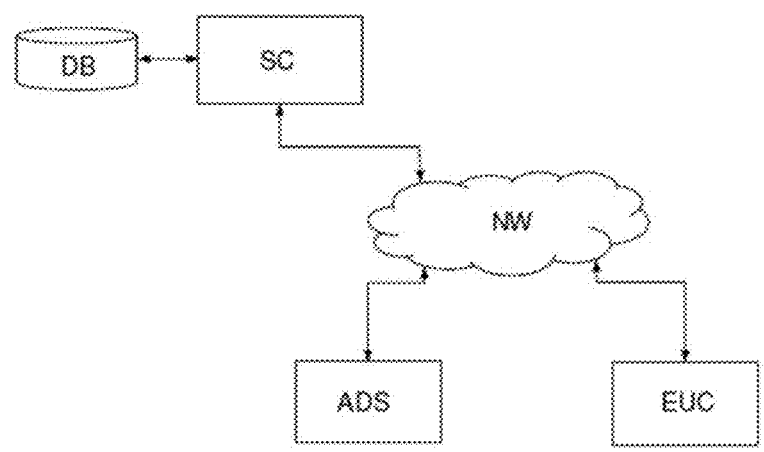

FIG. 42 is a block diagram of a computer system suitable for carrying out a method according to a different exemplary embodiment.

In FIG. 42, the executable program and the computer files comprising the designed 3D object are stored on memory devices DB connected to a server SC. The memory devices and the overall architecture of the server may be the same as discussed above with reference to FIG. 41, except that display controller, sensitive surface, display, keyboard and/or pointing device may be missing in the server.

The server SC is then connected to an administrator system ADS and end user computer EUC via a network NW.

The invention claimed is:

1. A computer implemented method for designing a 3D object in a scene, comprising:
   a) obtaining a 3D grid of cubes in the scene, said 3D grid of cubes controlling a subdivision surface, said subdivision surface modeling the 3D object;
   b) receiving a user stroke of a curve on at least one external face of at least a cube of the 3D grid of cubes;
   c) determining a first set of cubes which intersect with the curve on the external face, a second set of cubes which is adjacent to the first set of cubes, perpendicularly to the external face, and a third set of cubes, including the first set of cubes and the second set of cubes;
   c') computing a number of cubes of the 3D grid of cubes on both sides of the cube of the first set of cubes in a plane of the external face, removing, from the scene, a set of cubes on one side which has a lower number of cubes than a set on the other side, and removing the corresponding cubes of the second set of cubes; and
   d) for each cube of the third set of cubes, deforming the cube by moving at least one vertex of said cube to fit the curve, thereby deforming the subdivision surface.

2. The computer implemented method according to claim 1, wherein step d) further comprises filtering vertices of the cubes of the third set of cubes to move only vertices which are not shared with vertices of cubes which do not intersect with the curve.

3. The computer implemented method according to claim 1, wherein step d) further comprises propagating the curve on the second set of cubes, and moving vertices of the second set of cubes to fit a propagated curve.

4. The computer implemented method according to claim 1, wherein the vertex is moved by applying an orthogonal projection of the vertex on the curve.

5. The computer implemented method according to claim 1, further comprising:
   computing a shortest distance between each vertex of a plurality of vertices and the curve; and
   correcting a position of one of said vertices to have a continuity of the subdivision surface, if the shortest distance to the curve is equal for at least two vertices.

6. The computer implemented method according to claim 1, wherein step a) further comprises detecting a user interaction comprising contiguously adding or removing cubes of the first and/or second set of cubes by hovering over the 3D object while holding a pointing element.

7. The computer implemented method according to claim 1, wherein the scene is located in an immersive environment.

8. The computer implemented method according to claim 1, wherein the subdivision surface is computed by using a Catmull-Clark scheme.

9. The computer implemented method according to claim 1, wherein the 3D grid of cubes and the subdivision surface are superimposed, the 3D grid of cubes being displayed in partial transparency.

10. The computer implemented method according to claim 1, further comprising receiving a user input comprising drawing a line in the scene, a design of the 3D object being completed by computing a symmetric of the subdivision surface with regards to the line.

11. A non-transitory computer-readable data-storage medium having stored thereon computer-executable instructions that when executed by a computer system cause the computer system to carry out a method for designing a 3D object in a scene, the method comprising:
   a) obtaining a 3D grid of cubes in the scene, said 3D grid of cubes controlling a subdivision surface, said subdivision surface modeling the 3D object;
   b) receiving a user stroke of a curve on at least one external face of at least a cube of the 3D grid of cubes;
   c) determining a first set of cubes which intersect with the curve on the external face, a second set of cubes which is adjacent to the first set of cubes, perpendicularly to the external face, and a third set of cubes, including the first set of cubes and the second set of cubes;
   c') computing a number of cubes of the 3D grid of cubes on both sides of the cube of the first set of cubes in a plane of the external face, removing, from the scene, a set of cubes on one side which has a lower number of cubes than a set on the other side, and removing the corresponding cubes of the second set of cubes; and
   d) for each cube of the third set of cubes, deforming the cube by moving at least one vertex of said cube to fit the curve, thereby deforming the subdivision surface.

12. A computer system comprising:
   a processor coupled to a memory, the memory storing computer-executable instructions for designing a 3D object in a scene that when executed by the processor cause the processor to be configured to:
   a) obtain a 3D grid of cubes in the scene, said 3D grid of cubes controlling a subdivision surface, said subdivision surface modeling the 3D object, b) receive a user stroke of a curve on at least one external face of at least a cube of the 3D grid of cubes, c) determine a first set of cubes which intersect with the curve on the external face, a second set of cubes which is adjacent to the first set of cubes, perpendicularly to the external face, and a third set of cubes, including the first set of cubes and the second set of cubes, c') compute a number of cubes of the 3D grid of cubes on both sides of the cube of the first set of cubes in a plane of the external face, remove, from the scene, a set of cubes on one side which has a lower number of cubes than a set on the other side, and remove the corresponding cubes of the second set of cubes; and d) for each cube of the third set of cubes, deform the cube by moving at least one vertex of said cube to fit the curve, thereby deforming the subdivision surface.

13. The non-transitory computer-readable data-storage medium according to claim 11, wherein step d) further comprises filtering vertices of the cubes of the third set of cubes to move only vertices which are not shared with vertices of cubes which do not intersect with the curve.

14. The non-transitory computer-readable data-storage medium according to claim 11, wherein step d) further comprises propagating the curve on the second set of cubes, and moving vertices of the second set of cubes to fit a propagated curve.

15. The non-transitory computer-readable data-storage medium according to claim 11, wherein the vertex is moved by applying an orthogonal projection of the vertex on the curve.

16. The non-transitory computer-readable data-storage medium according to claim 11, wherein the method further comprises:

computing a shortest distance between each vertex of a plurality of vertices and the curve; and correcting a position of one of said vertices to have a continuity of the subdivision surface, if the shortest distance to the curve is equal for at least two vertices.

17. The non-transitory computer-readable data-storage medium according to claim 11, wherein step a) further comprises detecting a user interaction comprising contiguously adding or removing cubes of the first and/or second set of cubes by hovering over the 3D object while holding a pointing element.

18. The non-transitory computer-readable data-storage medium according to claim 11, wherein the scene is located in an immersive environment or wherein the subdivision surface is computed by using a Catmull-Clark scheme.

19. The non-transitory computer-readable data-storage medium according to claim 11, wherein the 3D grid of cubes and the subdivision surface are superimposed, the 3D grid of cubes being displayed in partial transparency.

20. The non-transitory computer-readable data-storage medium according to claim 11, wherein the method further comprises receiving a user input comprising drawing a line in the scene, a design of the 3D object being completed by computing a symmetric of the subdivision surface with regards to the line.

* * * * *